(12) United States Patent
Litmanen et al.

(10) Patent No.: US 10,511,467 B2
(45) Date of Patent: Dec. 17, 2019

(54) OSCILLATOR WITH PULSE-EDGE TUNING

(71) Applicant: TEXAS INSTRUMENTS INCORPORATED, Dallas, TX (US)

(72) Inventors: Petteri Matti Litmanen, Richardson, TX (US); Nikolaus Klemmer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/408,399

(22) Filed: Jan. 17, 2017

(65) Prior Publication Data

US 2017/0207747 A1    Jul. 20, 2017

Related U.S. Application Data

(60) Provisional application No. 62/279,191, filed on Jan. 15, 2016.

(51) Int. Cl.
*H04L 27/00* (2006.01)
*H03H 17/08* (2006.01)
(Continued)

(52) U.S. Cl.
CPC ........... *H04L 27/0014* (2013.01); *H03B 5/24* (2013.01); *H03B 19/14* (2013.01); *H03B 27/00* (2013.01);
(Continued)

(58) Field of Classification Search
CPC . H03L 7/099; H03L 7/093; H03L 7/10; H03L 2207/06; H03L 7/0891; H03L 7/0995; H03L 7/18; H03L 7/085; H03L 7/898; H03L 7/095; H03L 7/107; H03L 7/1976; H03L 2207/05; H03L 7/07;
(Continued)

(56) References Cited

U.S. PATENT DOCUMENTS

| | | | | |
|---|---|---|---|---|
| 7,952,436 B2 * | 5/2011 | Wu | ........................ | H03L 7/0898 327/156 |
| 2010/0315148 A1 * | 12/2010 | Zhu | ...................... | H03K 5/1565 327/298 |

OTHER PUBLICATIONS

N. Klemmer, S. Akhtar, V. Srinivasan, P. Litmanen, et. al., A 45nm CMOS RF-to-Bits LTE/WCDMA FDD/TDD 2x2 MIMO basestation transceiver SoC with 200MHz RF bandwidth, IEEE ISSCC Dig. Tech. Papers, vol. 59, pp. 164-165, Feb. 1-3, 2016.

* cited by examiner

*Primary Examiner* — Arnold M Kinkead
(74) *Attorney, Agent, or Firm* — John R. Pessetto; Charles A. Brill; Frank D. Cimino

(57) ABSTRACT

An oscillator architecture with pulse-edge tuning to control the pulse rising and falling edges (such as for duty cycle correction), including a signal generator with a pull-up PMOS transistor coupled to a high rail, and a pull-down NMOS transistor coupled to a low rail. Pulse-edge tuning circuitry includes a high-side tuning PMOS transistor between the high rail and a source terminal of the pull-up PMOS transistor, and a low-side tuning NMOS transistor between the low rail and a source terminal of the pull-down NMOS transistor. Both tuning FETs are controlled for operation as a variable resistor by respective high-side and low-side DACs to provide tuning control signals to the tuning FETs. In an example application, the oscillator design is adapted for a direct conversion RF signal chain (TX and/or RX) including an I-Path and a Q-Path: the signal generator generates ±I and ±Q differential signal frequencies.

18 Claims, 5 Drawing Sheets

(51) Int. Cl.
*H03H 11/20* (2006.01)
*H03B 19/14* (2006.01)
*H03B 27/00* (2006.01)
*H04B 1/30* (2006.01)
*H03L 7/099* (2006.01)
*H03B 5/24* (2006.01)
*H03M 1/66* (2006.01)
*H03K 5/156* (2006.01)

(52) U.S. Cl.
CPC ............ *H03H 11/20* (2013.01); *H03H 17/08* (2013.01); *H03K 5/1565* (2013.01); *H03L 7/099* (2013.01); *H03B 2201/0208* (2013.01); *H03M 1/661* (2013.01); *H04B 1/30* (2013.01)

(58) Field of Classification Search
CPC ..... H04L 27/0014; H03B 19/14; H03B 27/00; H03B 2201/0208; H03B 5/24; H04B 1/30; H03M 1/661; H03K 5/1565
USPC .......... 331/111, 143, 57; 327/298, 156, 159, 327/172; 455/260, 255; 375/296
See application file for complete search history.

OSCILLATOR WITH PULSE-EDGE TUNING

CROSS-REFERENCE TO RELATED APPLICATIONS

Priority is claimed under 37 CFR 1.78 and 35 USC 119(e) to U.S. Provisional Application 62/279,191, filed Jan. 15, 2016), which is incorporated by reference.

BACKGROUND

Technical Field.

This Patent Disclosure relates generally to oscillators, such local oscillators for use in direct conversion RF transmit/receive.

Related Art

Wireless direct conversion architecture use direct RF upconversion (TX signal chain) and/or downconversion (RX signal chain), eliminating conversion at an intermediate frequency (IF). Direct conversion architectures encompass zero and low IF designs, both commonly referred to as zero IF.

Direct conversion (zero IF) architectures commonly use quadrature (IQ) signal conversion (modulation/demodulation), and digital filtering. FIG. 1 functionally illustrates a direct conversion transceiver 10 including I and Q signal paths. For the TX signal path, a digital baseband (BB) signal is input to I and Q signal chains, and converted by DACs 12/14 to analog, and then upconverted to RF by IQ mixers 16/18. The IQ mixers 16/18 are driven by a local oscillator (LO) 20.

Quadrature mismatch/imbalance between the I and Q signal chains generates image signal energy in an image sideband reflected about the LO frequency. The undesired image (sideband) signal energy can appear in frequency bands outside the channel reserved for the TX signal. IQ mismatch can be errors in amplitude, phase and delay.

While this Background information references a direct conversion RF transceiver system, this Patent Disclosure is more generally directed to oscillator design.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for an oscillator design with pulse-edge tuning, such as can be used in implementing a local oscillator design for a direct conversion RF transmit/receive.

According to aspects of the Disclosure, the the oscillator architecture includes pulse-edge tuning. The oscillator includes a signal generator generating at least two signal frequencies, and a logic circuit (such as an AND gate) that combines the signal frequencies to generate a corresponding oscillator signal. The logic circuit includes a pull-up PMOS transistor coupled to a high rail, and a pull-down NMOS transistor coupled to a low rail. Duty cycle tuning/correction circuitry includes high and low side tuning FETs: a high-side tuning PMOS transistor is coupled between the high rail and a source terminal of the pull-up PMOS transistor, and a low-side tuning NMOS transistor is coupled between the low rail and a source terminal of the pull-down NMOS transistor. Both tuning FETs are controlled for operation as a variable resistor by respective high-side and low-side DACs (digital to analog converters) configure to provide a tuning control signals to the tuning FETs (variable resistance) based on respective input digital tuning/correction signals. In an example application, the oscillator design is adapted for a direct conversion RF transmit chain including an I-Path and a Q-Path: the signal generator generates ±I and ±Q differential signal frequencies, and each signal frequency is generated by a separate logic circuit (such as an AND gate), including pulse-edge tuning/correction circuitry.

Other aspects and features of the invention claimed in this Patent Document will be apparent to those skilled in the art from the following Disclosure.

BRIEF DESCRIPTION OF THE DRAWINGS

FIG. 2A illustrates an example embodiment of a 4-φ (IQ±) LO design [20], including a PLL [21], and a 4-φ generator [25] that includes a quadrature frequency divider [26] and 4-φ AND gates 30; and FIG. 2B illustrates an example D flip-flop quadrature frequency divider [26].

FIG. 3A illustrates an example AND gate design and FIG. 3B illustrates an example NAND gate design, both with pulse-edge control based on DAC-controlled high/low-side current sources to control charge/discharge of a capacitive load.

DETAILED DESCRIPTION

This Description and the Drawings constitute a Disclosure for an oscillator with pulse-edge tuning, including describing example embodiments, and illustrating various technical features and advantages. An example application is for implementing a local oscillator (LO) design for direct conversion RF TX/RX transceiver systems with LO-driven upconversion/downconversion in the transmit/receive signal chains.

In brief overview an oscillator architecture with pulse-edge tuning. The oscillator includes a signal generator generating at least two signal frequencies, and a logic circuit (such as an AND gate) that combines the signal frequencies to generate a corresponding oscillator signal. The logic circuit includes a pull-up PMOS transistor coupled to a high rail, and a pull-down NMOS transistor coupled to a low rail. Duty cycle tuning/correction circuitry includes high and low side tuning FETs: a high-side tuning PMOS transistor is coupled between the high rail and a source terminal of the pull-up PMOS transistor, and a low-side tuning NMOS transistor is coupled between the low rail and a source terminal of the pull-down NMOS transistor. Both tuning FETs are controlled for operation as a variable resistor by respective high-side and low-side DACs (digital to analog converters) configure to provide a tuning control signals to the tuning FETs (variable resistance) based on respective input digital tuning/correction signals. In an example application, the oscillator design is adapted for a direct conversion RF transmit chain including an I-Path and a Q-Path: the signal generator generates ±I and ±Q differential signal frequencies, and each signal frequency is generated by a separate logic circuit (such as an AND gate), including pulse-edge tuning/correction circuitry.

Figure 1:
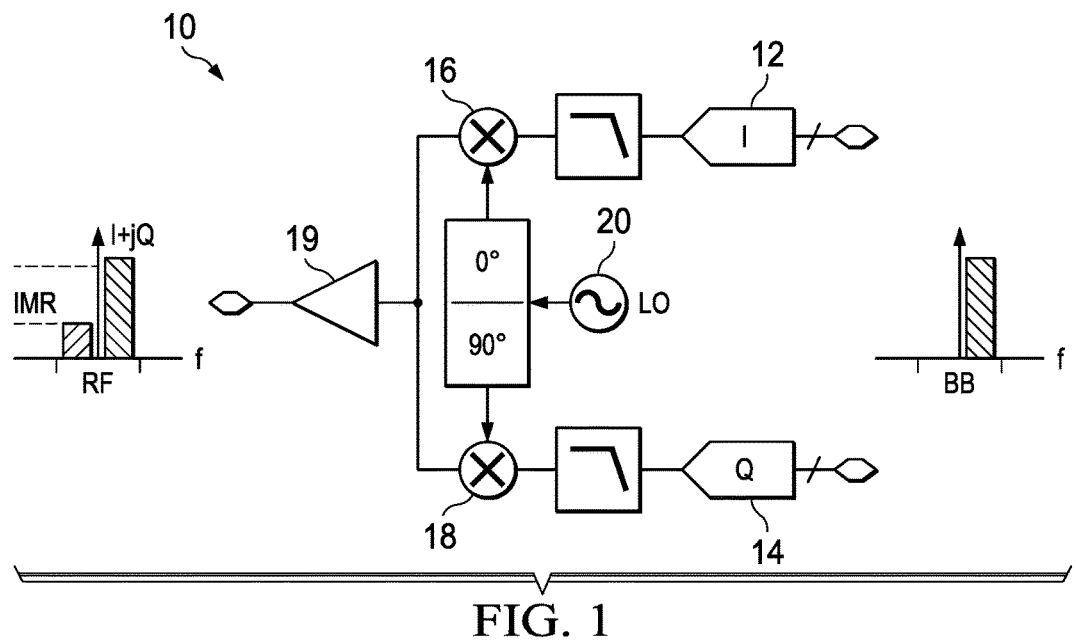
FIG. 1 functionally illustrates FIG. 1 a direct conversion transceiver including IQ signal paths with IQ upconversion/downconversion using a local oscillator [20], and illustrating image (sideband) signal energy resulting from IQ mismatch/imbalance between the I and Q signal paths (image signal energy reflected about the LO frequency).
Figure 2A:
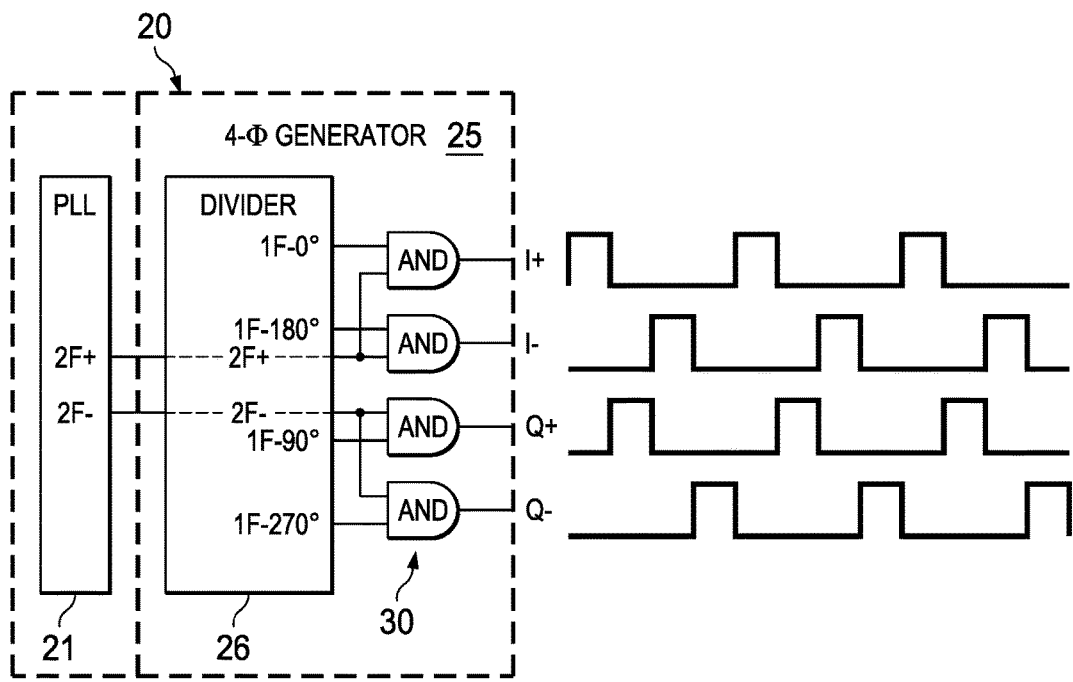
FIGS. 2A and 2B illustrate example embodiments of a local oscillator (LO) design [20], such as for direct conversion RF with TX/RX IQ signal paths.
Figure 2B:
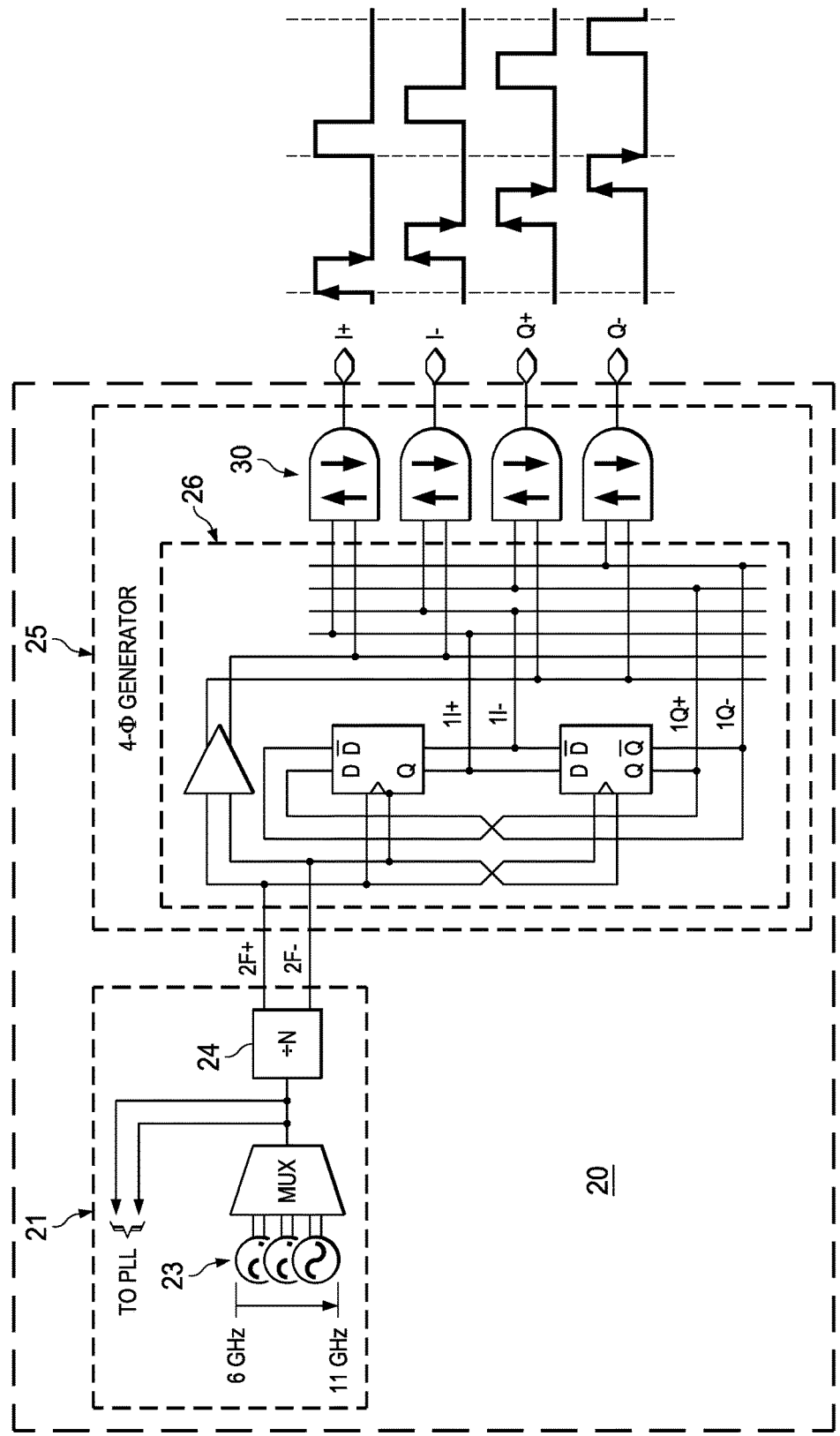

FIGS. 2A and 2B illustrate example embodiments of a local oscillator design 20, such as for direct conversion RF with TX/RX IQ signal paths.

FIG. 2A illustrates an example embodiment of a 4-φ (I±Q±) LO design 20. LO 20 includes a PLL 21, and a 4-φ generator 25, which includes a quadrature frequency divider 26, and 4-φ (I±Q±) AND gates 30.

PLL 21 generates 2F± signal inputs to the quadrature frequency divider 26. Quadrature divider 26 generates 1F signals at 0/90/180/270 degrees, corresponding to 1F IQ± signals.

The 2F± and 1F IQ± signals are input to the 4-φ AND gates 30, which generate the quadrature LO IQ± signals. As described in connection with FIGS. 3A/3B, the 4-φ AND gates 30 implement pulse-edge tuning according to this Disclosure.

FIG. 2B illustrates an example D flip-flop quadrature frequency divider 26, implemented with D latches 27 and 28. The D flip-flop quadrature divider 26 receives 2F± from PLL 21, divided to generate 1F IQ± gating signals (0/90/180/270) for the four 4-φ AND gates 30.

The example PLL 21 is implemented with three VCOs 23 with overlapping tuning ranges 6.8-10.8 GHz. A programmable frequency divider 24 is used to cover the 3GPP band.

PLL 21 outputs the 2F± to the quadrature frequency divider 26. The PLL 2F± signals are input to the D latches 27/28, which are interconnected to provide divide-by-2 1F IQ± signals. These signals are used to gate the 4-φ AND gates 30, generating 25% duty cycle LO IQ± signals.

Figure 3A:
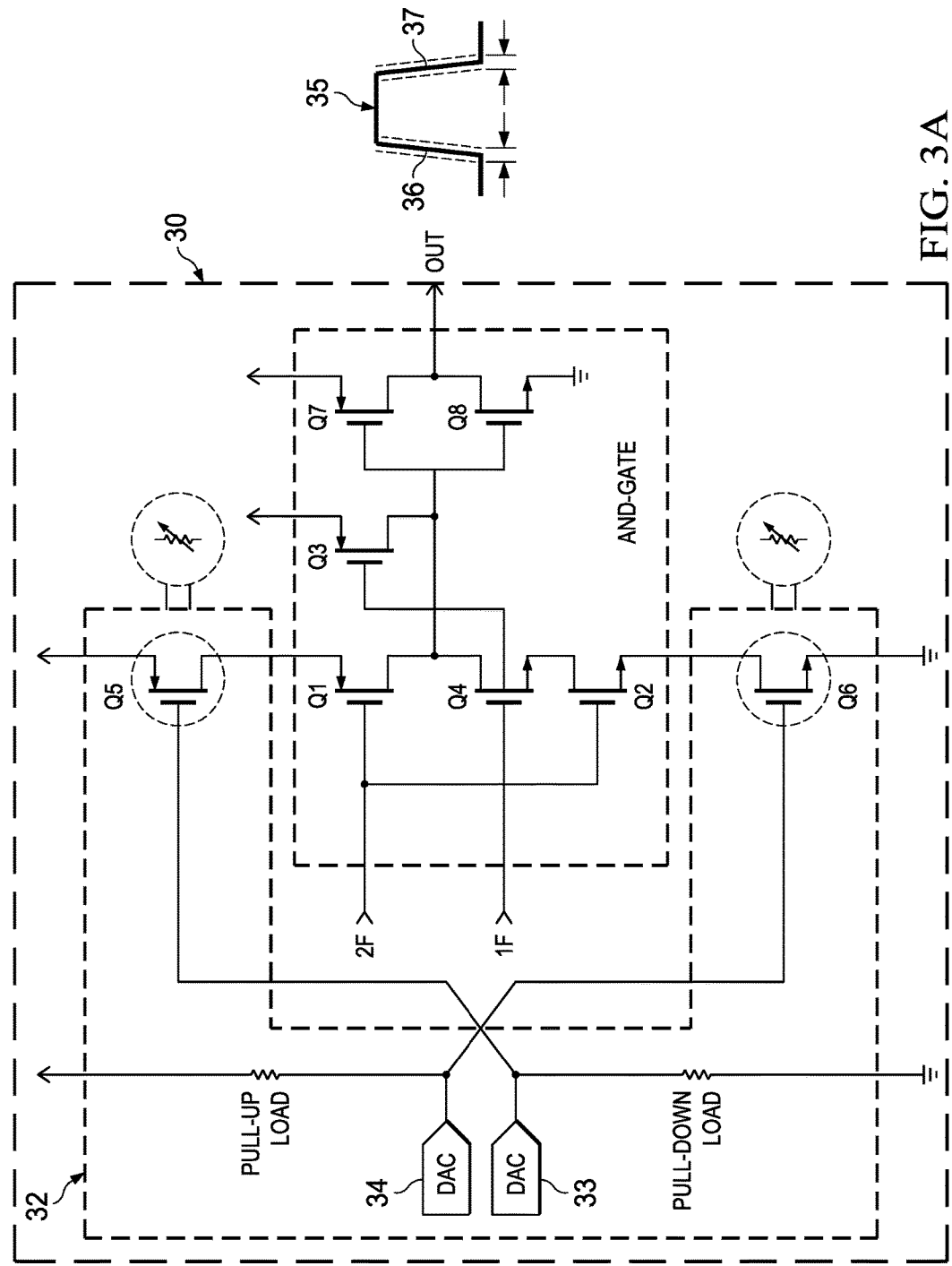
FIGS. 3A and 3B illustrate example embodiments of oscillator pulse-edge tuning according to this Disclosure, based on example AND/NAND gate designs with adjustable rising/falling pulse-edge control, such as can be used to implement the example 4-φ local oscillator design of FIGS. 2A/2B.
Figure 3B:
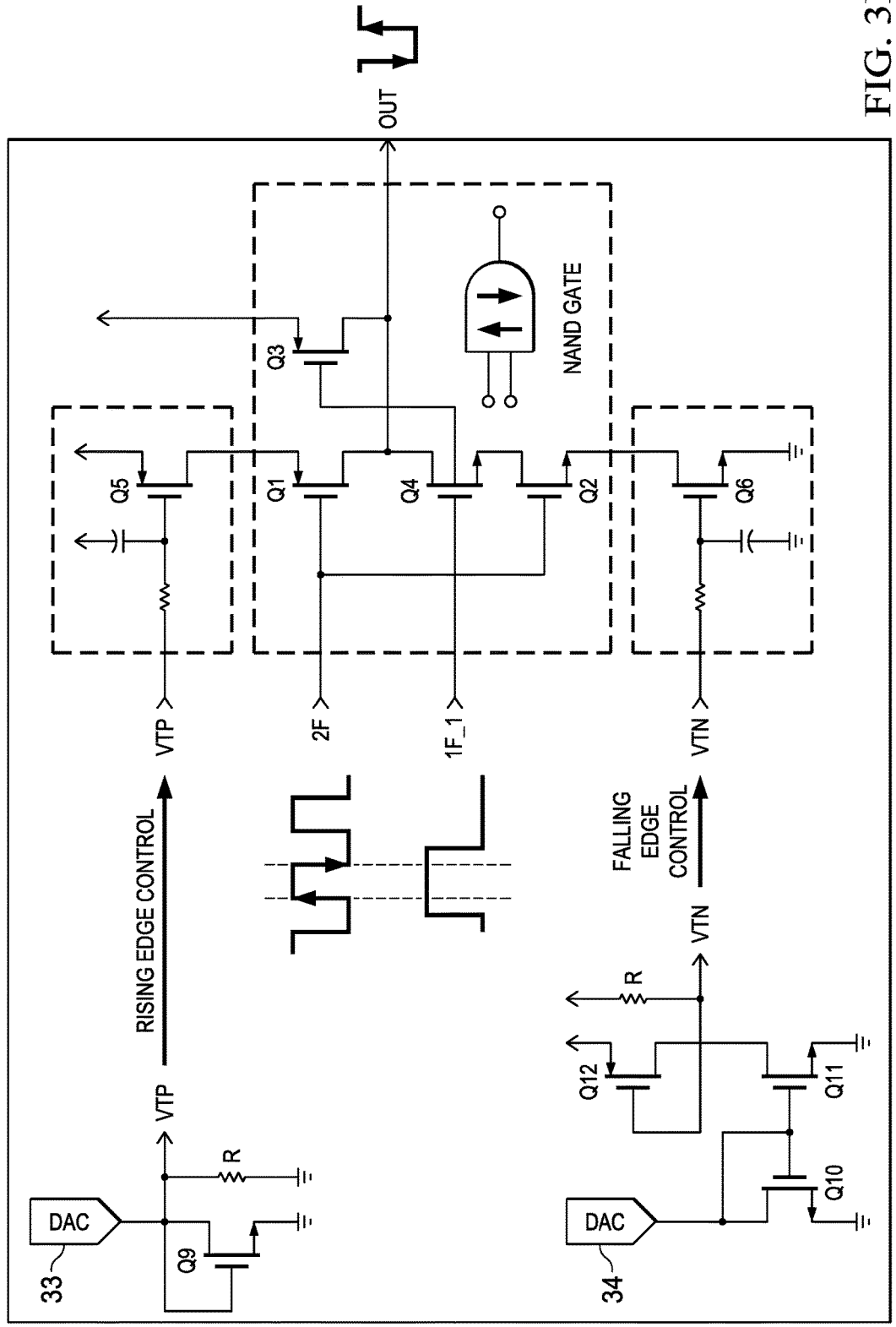

FIGS. 3A and 3B illustrate example embodiments of oscillator pulse-edge tuning according to this Disclosure, such as can be used to implement the example 4-φ local oscillator design of FIGS. 2A/2B. FIGS. 3A/3B respectively illustrate 4-φ AND/NAND gates 30 including adjustable rising/falling pulse-edge control according to this Disclosure.

LO pulse-edge control is used to increase sideband suppression. LO signal edges are adjusted to compensate for small errors caused by IQ mismatch/imbalance. In particular, LO pulse-edge control according to this Disclosure provides more adjustment variables than available by adjusting LO bias voltages.

FIG. 3A illustrates an example 4-φ AND gate 30 with pulse-edge tuning, including an AND gate 31A, and rising/falling pulse-edge control circuitry 32. AND gate 31A includes a PMOS/NMOS input inverter Q1/Q2 that receives the PLL 2F signal, and PMOS/NMOS switches Q3/Q4 controlled by the 1F gating signals generated by the quadrature frequency divider 26. An output inverter Q7/Q8 provides LO pulses 35 as the 4-φ AND gate output.

Pulse-edge control circuitry 32 includes a high-side PMOS current source Q5 coupled to the PMOS Q1 source, and a low-side NMOS current source Q6 coupled to the NMOS Q2 source. Both Q5/Q6 current sources are biased in the linear region to provide variable resistance for rising/falling pulse-edge tuning.

High/low side current sources Q5/Q6 are controlled respectively by high-side and low-side control DACs 33 and 34. Control DACs 33/34 generate analog tuning voltages input to respective Q5/Q6 control gates, controlling the Q5/Q6 current sources (resistance) to control rising/falling pulse-edge tuning.

Pulse-edge control circuitry 32 provides pulse-edge tuning for the rising/falling edges 36/37 of the LO pulses 35 based on current starving to control charging/discharging of a capacitive load at the output of the 4-φ AND gate 30. Control DAC 33 controls high-side current source Q5 to control charging the load capacitance through Q5/Q1, providing adjustment/control for the rising pulse-edge 36 of the LO IQ± pulses 35. Control DAC 34 controls low-side current source Q5 to control discharging the load capacitance through Q4/Q2/Q6, providing adjustment/control for the falling pulse-edge 37 of the LO IQ± pulses 35.

FIG. 3B illustrates an example 4-φ NAND gate 30 with pulse-edge tuning. NAND gate 31B includes PMOS/NMOS input inverter Q1/Q2 that receives the PLL 2F signal, and PMOS/NMOS switches Q3/Q4 controlled by the 1F gating signals generated by the quadrature frequency divider 26.

Control DAC 33 provides a VTP control voltage to high-side current source Q5 to control charging load capacitance, and provide rising pulse-edge control. Diode-connected Q9 and the parallel resistor provide tuning linearity.

Control DAC 34 and current mirror Q10/Q11 provide a VTN control voltage to low-side current source Q5 to control discharging load capacitance and provide falling pulse-edge control. Diode-connected Q12 and the parallel resistor provide tuning linearity.

Oscillator pulse-edge tuning according to this Disclosure enables tuning adjustment for oscillator pulses, including tuning control for pulse position and duty cycle (symmetry).

For the example application of direct conversion RF TX/RX, pulse-edge tuning can be used to implement LO pulse-edge adjustment to compensate/correct for gain/phase/delay errors resulting from IQ mismatch/imbalance, supplementing other forms of QMC (quadrature mismatch compensation) to achieve further image sideband suppression. Pulse-edge tuning uses DC biasing that avoids adding parasitics, or introducing phase noise.

As design examples, QMC pulse-edge tuning can be used to provide IQ gain and phase mismatch compensation/adjustment by expansion/compression of I/Q LO pulses without shifting pulse-center. For IQ gain mismatch compensation, narrower LO pulses in the I signal path can be used to decrease gain, and wider pulses in the Q signal path can be used to increase gain. For IQ phase mismatch compensation, equal left/right shift of I/Q LO pulses can be used without pulse-area change, for example, an LO I-pulse right-shift can be used in increase I-phase, and an LO Q-pulse left-shift can be used to decrease Q-phase.

As further design examples, a differential balance adjustment can be implemented by shifting LO I-pulses outward/inward to minimize RF feedthrough, and an LO pulse overlap adjustment can be implemented by shifting inward on all edges to control switching and minimize I/Q crosstalk.

As a further design example, two-phase pulse-edge tuning can be used to tune LO pulse edges. In the first phase, both rising and falling edges can be adjusted together until a local optimum is reached. This is repeated for all four LO signals IQ±. In the second phase, each edge is adjusted individually for fine correction.

Figure 4:
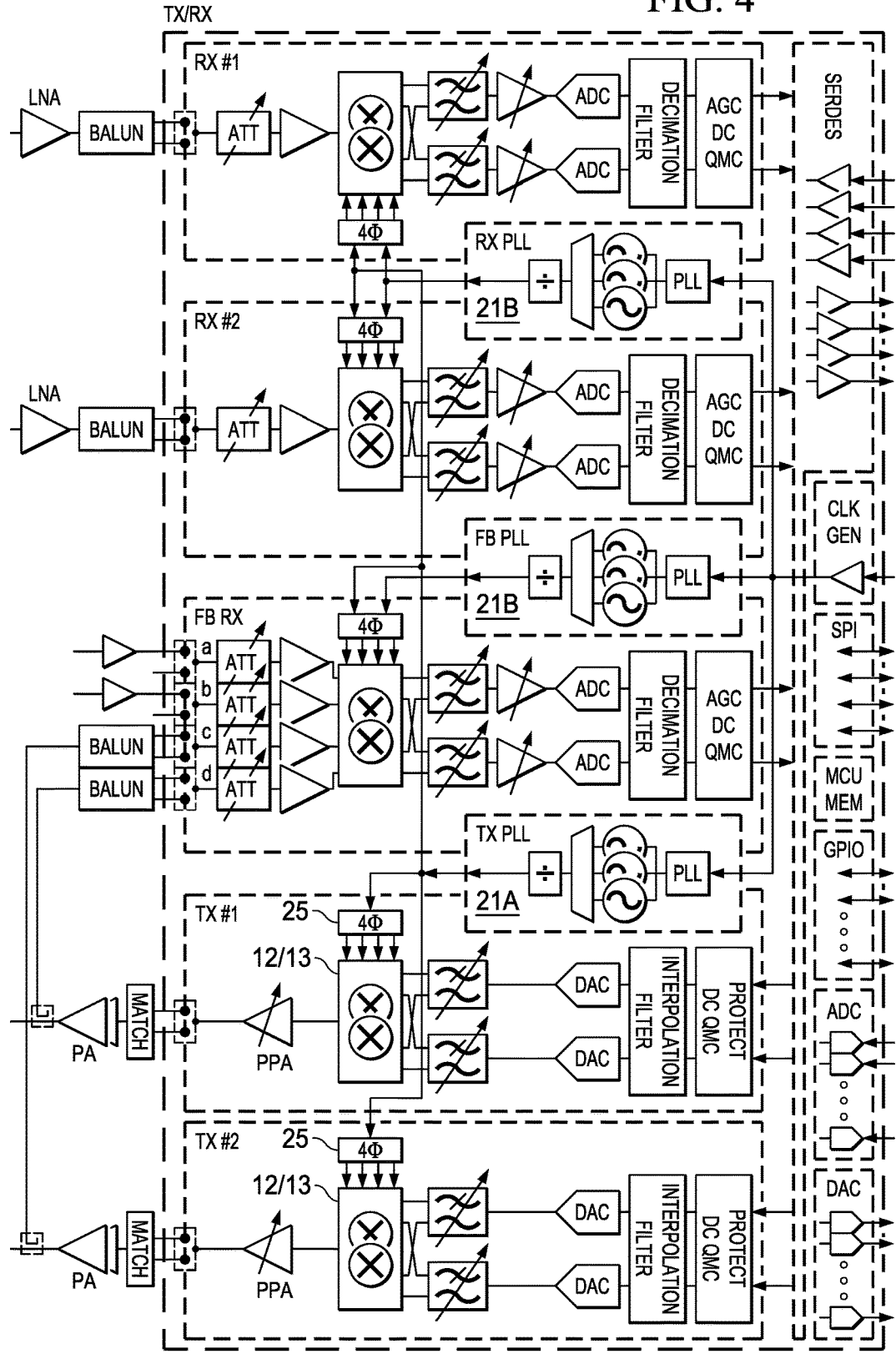
FIG. 4 illustrates an example direct conversion TX/RX transceiver design, including TX/RX and FBRX signal paths with respective PLLs (21A/21B/21C) driving respective 4-φ generators [25].

FIG. 4 illustrates an example direct conversion RF transceiver design TX/RX. The TX/RX transceiver includes two TX/RX channels, and a feedback RX channel FBRX used to capture TX data such as for QMC compensation.

The TX/RX transceiver includes separate PLLs for TX/RX 21A/21B and FBRX 21C. During normal TX/RX transceiver operation, TX PLL 21A is shared by the TX and FBRX signal chains. The separate FBRX PLL 21C is used for QMC calibration.

For the TX signal paths, the TX PLL 21A provides PLL 2F± input to respective 4-φ generators 25 that drive LO IQ± signals to mixers 12/13. The 4-φ generators 25 implement LO pulse-edge tuning according to this Disclosure.

The Disclosure provided by this Description and the Figures sets forth example embodiments and applications illustrating aspects and features of the invention, and does not limit the scope of the invention, which is defined by the claims. Known circuits, connections, functions and operations are not described in detail to avoid obscuring the principles and features of the invention. These example embodiments and applications, including design examples, can be used by ordinarily skilled artisans as a basis for modifications, substitutions and alternatives to construct other embodiments, including adaptations for other applications.

The invention claimed is:

1. An oscillator circuit, comprising
an oscillator to generate a pulse signal, each pulse having a rising edge and a falling edge;
pulse-edge tuning circuitry coupled to receive the pulse signal and provide a pulse signal to an output terminal, the output terminal coupleable to a load having a load capacitance, the pulse-edge tuning circuitry including
a high-side current source controllable to provide a variable resistance, to control the rising edge of the pulse signal, including for charging the load capacitance; and
a low-side current source controllable to provide a variable resistance, to control the falling edge of the pulse signal, including for discharging the load capacitance;
a high-side DAC (digital to analog converter) to provide a control signal to the high-side current source based on a first input digital tuning signal; and
a low-side DAC to provide a control signal to the low-side current source based on a second input digital tuning signal;
the pulse-edge tuning circuitry generate the pulse signal based on the first and second input digital tuning signals.

2. The oscillator circuit of claim 1, wherein the oscillator circuit includes signal output circuitry to output the pulse signal, the signal output circuitry comprising one of an AND gate or a NAND gate.

3. The oscillator circuit of claim 1, adapted for use as a local oscillator in a direct conversion RF signal chain including an in-phase I-Path and a quadrature Q-Path,
wherein the oscillator circuit is configured to generate differential ±I and ±Q signal frequencies; and
wherein each signal frequency is generated by a separate logic circuit, including the pulse edge
tuning circuitry.

4. An oscillator circuit adapted for use as a local oscillator (LO) in an RF signal chain (transmit and/or receive) circuit, the oscillator circuit comprising:

a signal generator generating at least two signal frequencies;
a logic circuit configured to combine the signal frequencies to generate corresponding LO in-phase (I) and quadrature (Q) pulse signals, each with a rising edge and a falling edge, the logic circuit including
a pull-up PMOS transistor coupled to a high rail; and
a pull-down NMOS transistor coupled to a low rail; and
pulse-edge tuning circuitry including
a high-side tuning PMOS transistor coupled between the high rail and a source terminal of the pull-up PMOS transistor, and controllable for operation as a variable resistor, to control the rising edge of the pulse signals;
a low-side tuning NMOS transistor coupled between the low rail and a source terminal of the pull-down NMOS transistor, and controllable for operation as a variable resistor, to control the falling edge of the pulse signals;
a high-side DAC (digital to analog converter) configured to provide a control signal to the high-side tuning PMOS based on a first input digital tuning signal; and
a low-side DAC (digital to analog converter) configured to provide a control signal to the low-side tuning NMOS based on a second input digital tuning signal.

5. The oscillator circuit of claim 4, wherein the logic circuit outputs each of the I and Q pulse signals by one of an AND gate or a NAND gate.

6. The oscillator circuit of claim 4, wherein the at least two signal frequencies are differential signal frequencies.

7. The oscillator circuit of claim 6, wherein the RF signal chain includes an I-Path and a Q-Path,
wherein the signal generator generates differential ±I and ±Q signal frequencies; and wherein each signal frequency is generated by a separate logic circuit, including the pulse-edge tuning circuitry.

8. The oscillator circuit of claim 1, wherein
the high-side current source is a pull-up PMOS transistor coupled to a high rail; and
the low-side current source is a pull-down NMOS transistor coupled to a low rail.

9. The oscillator circuit of claim 1, wherein the pulse-edge tuning circuitry controls the rising and falling edge of the pulse signal for duty cycle correction.

10. The oscillator circuit of claim 1, wherein the oscillator outputs multiple pulse signals, and includes:
signal generator circuitry to generate multiple signals each with a different frequency; and
for each pulse signal, signal output circuitry to output the pulse signal based on the multiple signals;
the signal output circuitry comprising one of an AND gate or a NAND gate.

11. The oscillator circuit of claim 10, wherein the multiple pulse signals are in-phase (I) and quadrature (Q) signals.

12. The oscillator circuit of claim 4, wherein the pulse-edge tuning circuitry controls the rising and falling edge of the pulse signals for duty cycle correction.

13. An method of generating a pulse signal from an oscillator, each pulse having a rising edge and a falling edge, the method comprising:
controlling a high-side current source to provide variable resistance, to control the rising edge of the pulse signal; and controlling a low-side current source to provide a variable resistance, to control the falling edge of the pulse signal;

providing a control signal to the high-side current source based on a first input digital tuning signal generated by a high-side DAC (digital to analog converter); and providing a control signal to the low-side current source based on a second input digital tuning signal generated by a low-side DAC.

14. The method of claim 13, wherein the high-side current source is a pull-up PMOS transistor coupled to a high rail; and the low-side current source is a pull-down NMOS transistor coupled to a low rail.

15. The method of claim 13, wherein the rising and falling edge of the pulse signal is controlled for duty cycle correction.

16. The method of claim 13, wherein the controlling the rising and falling edges of the pulse signal includes charging and discharging a load capacitance.

17. The method of claim 13, wherein the oscillator outputs multiple pulse signals, and the method further includes:

generating multiple signals each with a different frequency; and for each pulse signal, outputting the pulse signal based on the multiple signals input to one of an AND gate or a NAND gate.

18. The method of claim 13, wherein the method is adapted for use in a local oscillator in a direct conversion RF signal chain including an in-phase I-Path and a quadrature Q-Path, and wherein the local oscillator is configured to generate separate pulse signals with differential ±I and ±Q signal frequencies.

* * * * *